(12) United States Patent
Hsu (10) Patent No.: US 7,429,755 B2
(45) Date of Patent: Sep. 30, 2008

(54) HIGH POWER LIGHT EMITTING DIODE

(75) Inventor: Chih-Peng Hsu, Yongkang (TW)

(73) Assignee: Advanced Optoelectronic Technology, Inc., Hukou Township (TW)

( * ) Notice: Subject to any disclaimer, the term of this patent is extended or adjusted under 35 U.S.C. 154(b) by 0 days.

(21) Appl. No.: 11/471,671

(22) Filed: Jun. 21, 2006

(65) Prior Publication Data

US 2007/0085089 A1    Apr. 19, 2007

(30) Foreign Application Priority Data

Oct. 13, 2005    (TW) ............................... 94135649 A (51) Int. Cl.
*H01L 27/15* (2006.01)
*H01L 29/22* (2006.01)

(52) U.S. Cl. .............................. 257/81; 257/85; 257/91; 257/94; 257/99; 257/100

(58) Field of Classification Search ................... 257/81, 257/91, 94, 99, 96, 79, E33.062, 85, 98, 100, 257/90; 438/22, 24
See application file for complete search history.

(56) References Cited

U.S. PATENT DOCUMENTS

| | | | |
|---|---|---|---|
| 6,307,218 B1 | 10/2001 | Steigerwald et al. | |
| 6,445,007 B1 * | 9/2002 | Wu et al. | 257/80 |
| 7,154,124 B2 * | 12/2006 | Han et al. | 257/88 |
| 2004/0222434 A1 * | 11/2004 | Uemura et al. | 257/99 |
| 2005/0133807 A1 * | 6/2005 | Park et al. | 257/99 |
| 2005/0224823 A1 * | 10/2005 | Zhao et al. | 257/91 |

* cited by examiner

*Primary Examiner*—Joseph Nguyen
(74) *Attorney, Agent, or Firm*—Oliff & Berridge, PLC (57) ABSTRACT

A high power LED comprises a substrate. An N-type semiconductor layer, an active layer and a P-type semiconductor layer are sequentially deposited on the substrate. A semi-insulator layer or a non-N-type semiconductor layer can be interposed between the N-type semiconductor layer and substrate. At least one N-type electrode is connected to the N-type semiconductor layer and is exposed to an opening of the active layer and P-type semiconductor layer. The N-type electrode with a centralized pattern is formed on the middle of the LED. Furthermore, at least one P-type electrode is coupled to the P-type semiconductor layer. The P-type electrode is arranged like a closed ring or an open ring surrounding the N-type electrode. Therefore, the distribution of current paths is dispersed, and illumination areas are simultaneously uniform.

8 Claims, 8 Drawing Sheets

FIG. 15 ated heat in
a certain area causes reductions in light efficiency and
lifespan of the LED.
HIGH POWER LIGHT EMITTING DIODE

BACKGROUND OF THE INVENTION

1. Field of the Invention

The present invention relates to a light emitting diode (LED), and more particularly to an LED with high brightness.

2. Description of the Related Art

The LED is generally applied to the indication lamps of household appliances, the back light source of liquid crystal displays, browsers, third brake lights for cars, etc. Recently, AlGaInP and AlGaInN are well developed as the material of the LED. Therefore, the conventional incandescent lamp is replaced with the LED in various applications.

Figure 1:
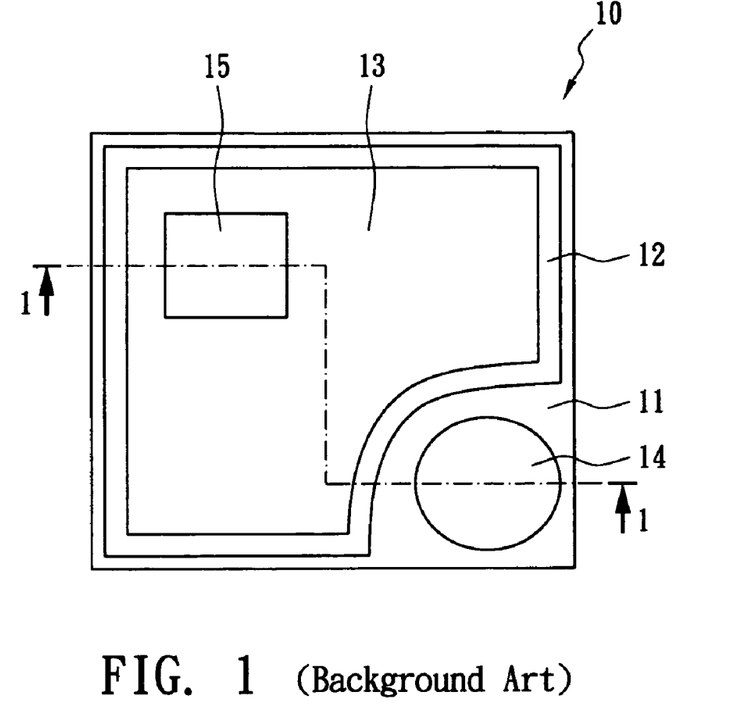
FIG. 1 is a top view of a conventional LED.
Figure 2:
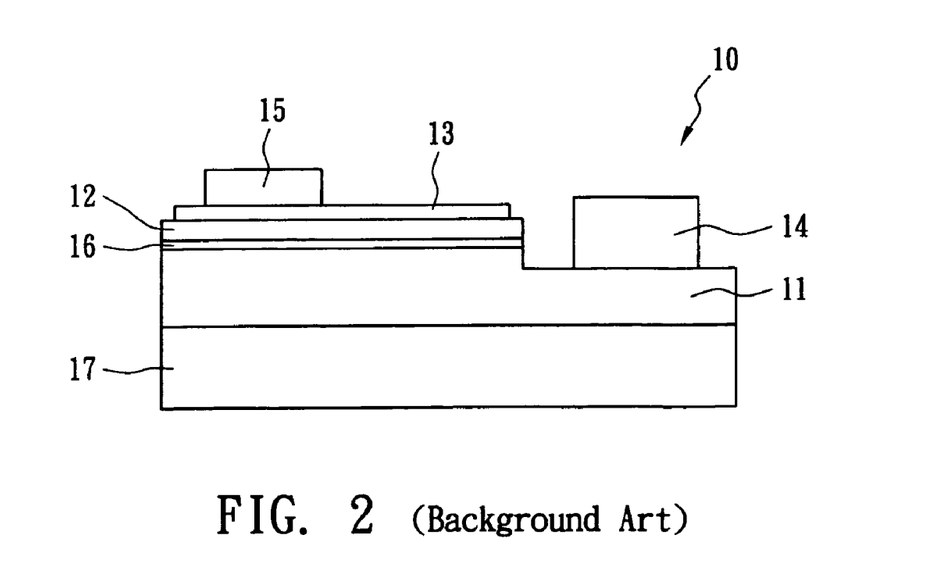
FIG. 2 is a cross-sectional view along line 1-1 in FIG. 1.

FIG. 1 and FIG. 2 are respectively the top view and cross-sectional view of a conventional LED 10, wherein FIG. 2 is along line 1-1 in FIG. 1. An N-type semiconductor layer 11, an active layer 16, a P-type semiconductor layer 12 and a transparent conductive layer 13 are sequentially formed on a substrate 17. Subsequently, an N-type electrode 14 and a P-type electrode 15 are formed after an etching step and a deposition step. The active layer 16 can be a homo junction, a hetero-junction, a double hetero-structure, a single quantum well, a multiple quantum well, etc.

Electrons generally move from the underside of the N-type electrode 14 to the P-type electrode 15, and meanwhile electronic holes move from the P-type electrode 15 to the N-type electrode 14. After the electrons and the holes are combined with each other at the active layer 16, light is emitted due to discharging energy. Either the electrons or the holes move along the shortest path between the P-type electrode 15 and the N-type electrode 14. Therefore, the combinations of the electrons and the holes concentrate in a local region of the active layer 16, but the majority of the active layer 16 is not used to generate light. Furthermore, generated heat concentrates at the same light region so that illumination and reliability are likely reduced.

Figure 3:
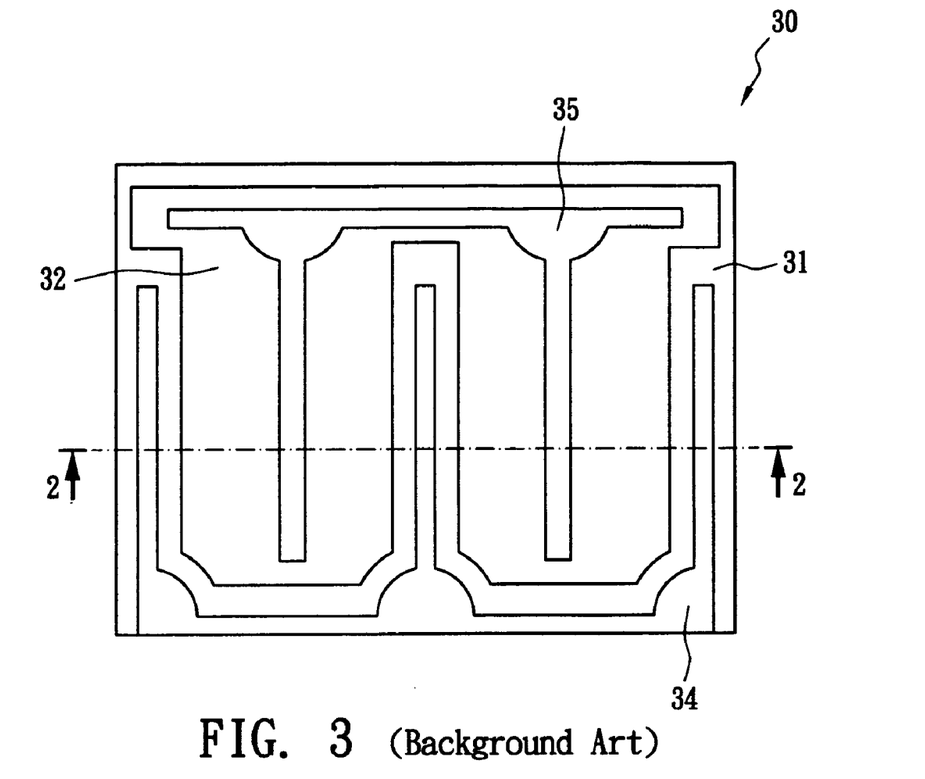
FIG. 3 is a top view of another conventional LED.
Figure 4:
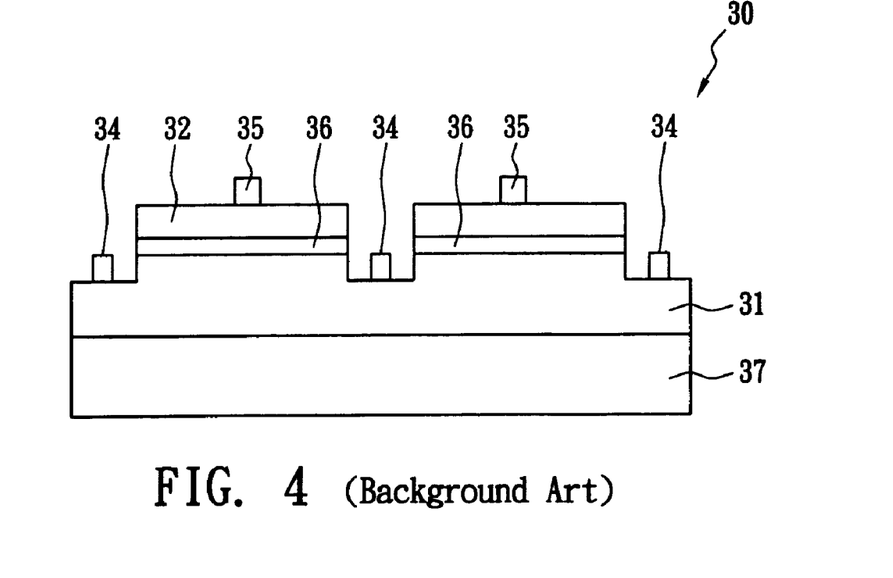
FIG. 4 is a cross-sectional view along line 2-2 in FIG. 3.

To solve the aforesaid problems, LumiLeds Lighting Co. put forth an improved structure of parallel electrodes disclosed in U.S. Pat. No. 6,307,218, as shown in FIG. 3. Either P-type electrodes 35 or N-type electrodes 34 like comb-shaped (or finger-shaped) are provided on a LED 30. In comparison with FIG. 1, the comb-shaped electrodes substantially increase the passing paths and distribution areas of current; hence the illumination efficiency of an active layer is improved. In this regard, such electrodes are especially suitable for large-area and high-brightness LEDs. FIG. 4 shows a cross-sectional diagram along line 2-2 in FIG. 3. Similarly, an N-type semiconductor layer 31, an active layer 36 and a P-type semiconductor layer are sequentially deposited on a substrate 37. Subsequently, the P-type electrodes 35 and N-type electrodes 34 are formed through deposition and etching steps.

Apparently, the merits of comb-shaped electrodes are especially suitable for a large-area LED; however, the tooth corners of the electrodes can possibly cause electrostatic charges to abnormally discharge so that the partial circuit is burned therein. On the other hand, the fabricating processes and corresponding masks for the comb-shaped electrodes require a relatively high level of precision, and as a result high-performance equipment with low throughput is needed to fabricate them. Otherwise, the yield rate of the LED fabrication is quite reduced. The middle region of the LED has less thermal dissipation than the edge region. Accumulated heat in a certain area causes reductions in light efficiency and lifespan of the LED.

In conclusion, the optoelectronic market urgently requires a large-area LED having reliable and uncomplicated electrodes so as to overcome the aforementioned shortcomings of the conventional LED with high brightness.

SUMMARY OF THE INVENTION

An objective of the present invention is to provide a high power LED with a uniform distribution of current and superior heat dissipation and improved illumination efficiency of an active layer.

Another objective of the present invention is to provide an LED having uncomplicated electrode patterns so as to prevent electrostatic charge accumulation, as well as to simplify the fabrication process.

Another objective of the present invention is to place an N-type electrode that is not sensitive to temperature variation at the middle of an LED, where heat dissipation and illumination efficiency are inferior to other areas of the LED.

Another objective of the present invention is to prevent heat from being retained in the middle of an LED.

Another objective of the present invention is to dissipate the heat of the middle of an LED through N-type electrodes.

Another objective of the present invention is to provide an LED having electrodes suitable to be mounted to a substrate or a submount made of $Al_2N_3$, silicon, PCB (printed circuit board), metal, etc.

To achieve these objectives, the present invention discloses a high power LED comprising a substrate. An N-type semiconductor layer, an active layer and a P-type semiconductor layer are sequentially deposited on the substrate. A semi-insulator layer or a non-N-type semiconductor layer can be interposed between the N-type semiconductor layer and substrate. At least a N-type electrode is connected to the N-type semiconductor layer and is exposed to an opening of the active layer and P-type semiconductor layer. The N-type electrode with a centralized pattern is formed on the middle of the LED. Furthermore, at least one P-type electrode is coupled to the P-type semiconductor layer. The P-type electrode is arranged like a closed ring or an open ring surrounding the N-type electrode. Therefore, the distribution of current paths is dispersed, and simultaneously illumination areas are uniform.

The P-type electrode further includes at least a soldering pad to which a metal wire or a bump is bonded. Furthermore, a transparent conductive layer is overlaid on the P-type electrode, and a reflective layer is further stacked on the P-type electrode.

A groove is formed on the transparent conductive layer surrounding the N-type electrode so that the transparent conductive layer is arranged like an open C shape. Moreover, the groove can be deepened into the N-type semiconductor layer so that the active layer and P-type semiconductor layer are also arranged like open C shapes.

Furthermore, a passive layer is overlaid on the surface of the LED, but the N-type electrode and P-type electrode are still uncovered.

BRIEF DESCRIPTION OF THE DRAWINGS

The invention will be described according to the appended drawings in which.

PREFERRED EMBODIMENT OF THE PRESENT INVENTION

Figure 5:
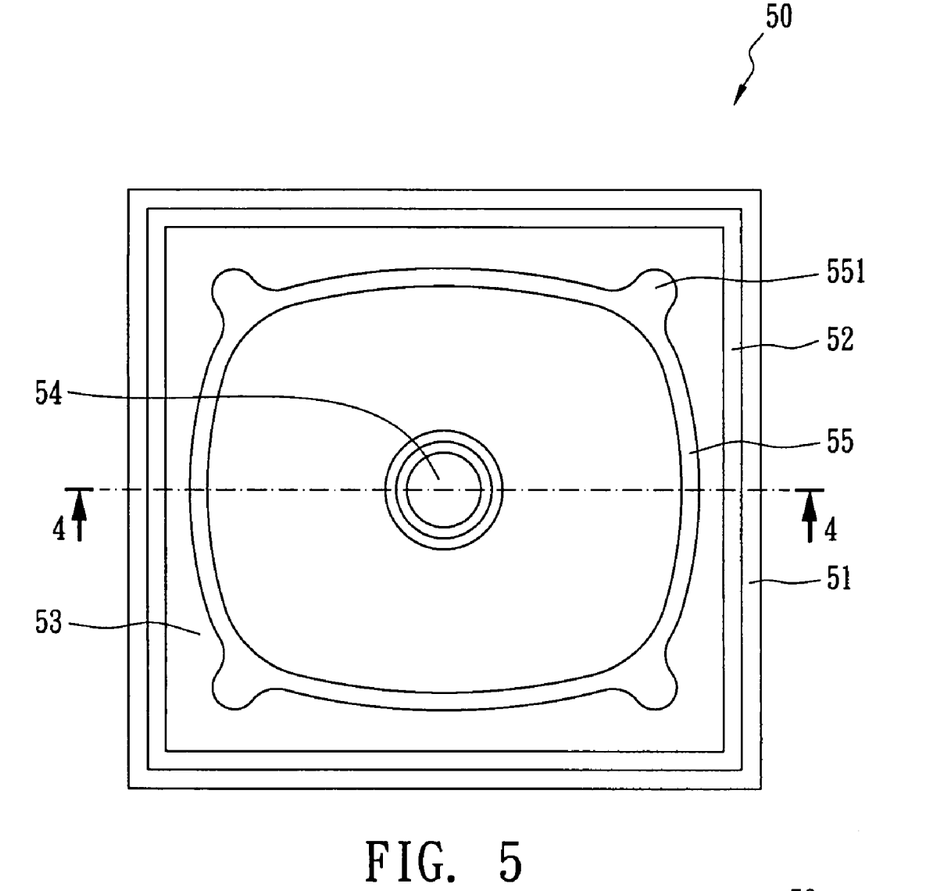
FIG. 5 is a top view of an LED in accordance with the first embodiment of the present invention.
Figure 6:
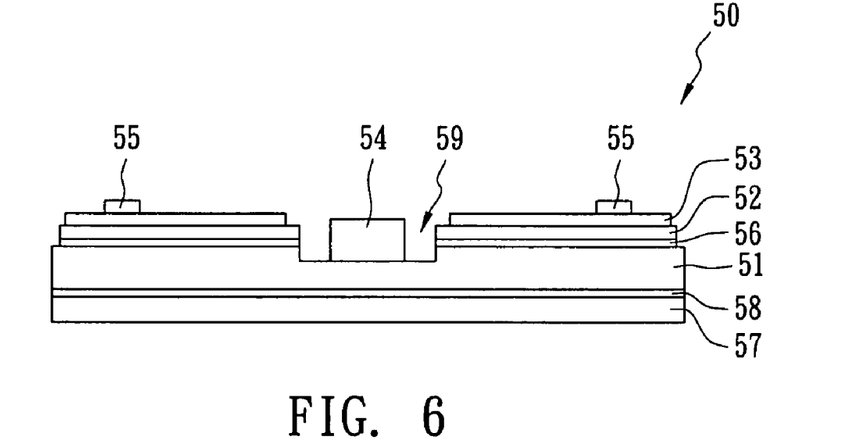
FIG. 6 is a cross-sectional view along line 4-4 in FIG. 5.

FIG. 5 and FIG. 6 are respectively the top view and cross-sectional view of a conventional LED 10, wherein FIG. 6 is along line 4-4 in FIG. 5. A high power LED 50 comprises a substrate 57. An N-type semiconductor layer 51, an active layer 56, a P-type semiconductor layer 52 and a transparent conductive layer 53 are sequentially deposited on the substrate 57. A semi-insulator layer 58 or a non-N-type semiconductor layer can be interposed between the N-type semiconductor layer 51 and substrate 57. A N-type electrode 54 with a centralized shape is connected to the under N-type semiconductor layer 51 through an opening 59. The N-type electrode with a centralized pattern is formed on the middle of the LED. As shown in FIG. 1, the round-shaped N-type electrode 54 is placed on the middle of the LED 50. A P-type electrode 55 coupled to the P-type semiconductor layer 52 is arranged like a closed ring or an open ring surrounding the N-type electrode 54, and is stacked on the transparent conductive layer 53. A plurality of the soldering pad 551 can be formed on the P-type electrode 55 so that metal wires and bumps are easily bonded on the P-type electrode 55 when the LED is processed during an IC package step. The substrate 57 can be made of sapphire, SiC, Si or GaAs. Moreover, the transparent conductive layer 53 can be made of ITO (indium tin oxide), tin oxide, copper oxide, indium zinc oxide, nickel gold or nickel gold oxide.

Because the P-type electrode 55 surrounds the N-type electrode 54, the current paths are uniformly distributed between the N-type electrode 54 and P-type electrode 55. Therefore, the majority of the active layer 56 can emit rays, and even the part of that beneath the active layer 56 is also likely to emit rays. Such arrangements of the N-type electrode 54 and P-type electrode 55 improve illumination efficiency, hence are especially suitable to be applied to the large-area and high power LED 50. On the other hand, because the illumination part of the active layer 56 is close to the edges of the LED 50, the heat generated by the illumination part is easily dissipated to its exterior. Furthermore, the pattern of either the N-type electrode 54 or the P-type electrode 55 prevents electrostatic charges from being accumulated at a certain corner, and is uncomplicated so as to reduce difficulty in fabrication processes.

The N-type electrode 54 is placed at the middle of the LED 50 where heat is not easily dissipated and illumination efficiency is inferior to other areas. Because the N-type electrode 54 is insensitive to temperature variation and the part of the active layer 56 near the N-type electrode 54 is not likely emit rays, heat generated from the middle is less for the LED 50 than for conventional LEDs. Even though some heat exists in the middle, the influence of the heat is not apparent to the LED 50. In conclusion, the heat from the middle is reduced to an insignificant level.

Figure 7:
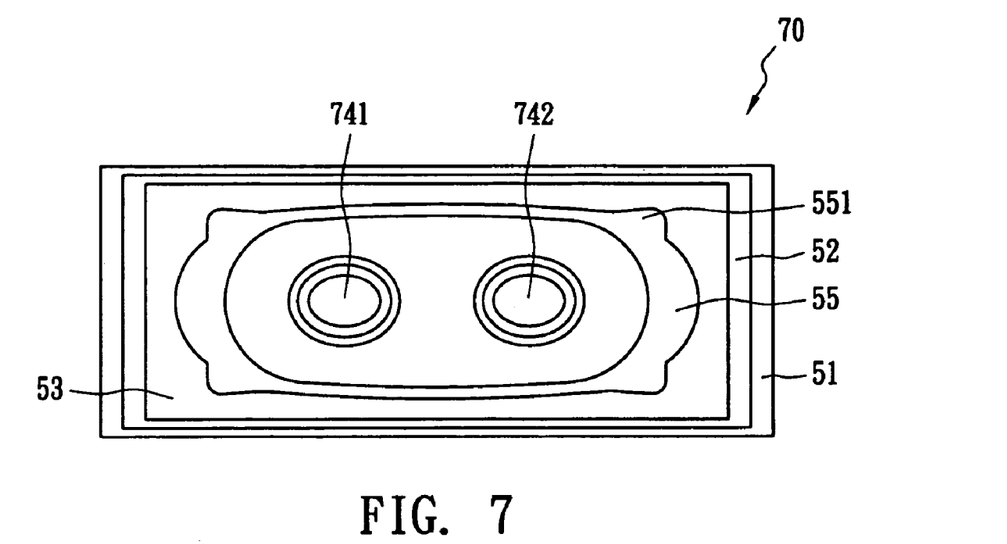
FIG. 7 is a top view of an LED in accordance with the second embodiment of the present invention.

FIG. 7 is a top view of an LED in accordance with the second embodiment of the present invention. In comparison with FIG. 5, there are two N-type electrodes 741 and 742 on the middle of an LED 70 so that metal wires and bumps are easily bonded on the N-type electrodes 741 and 742 when the LED 70 is processed during an IC package step.

Figure 8:
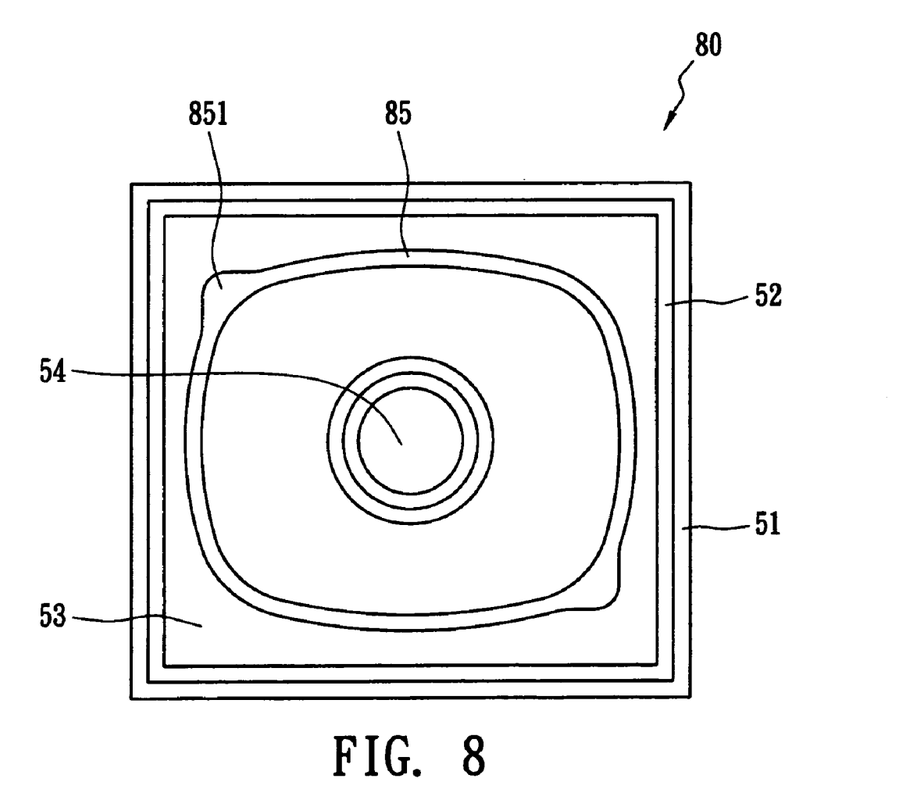
FIG. 8 is a top view of an LED in accordance with the third embodiment of the present invention.

An LED 80 in FIG. 8 has two soldering pads 851 diagonally placed on a P-type electrode 85, but the LED 50 has four soldering pads. However, the locations and numbers of the soldering pads are not limited by the disclosure of these embodiment's drawings.

Figure 9:
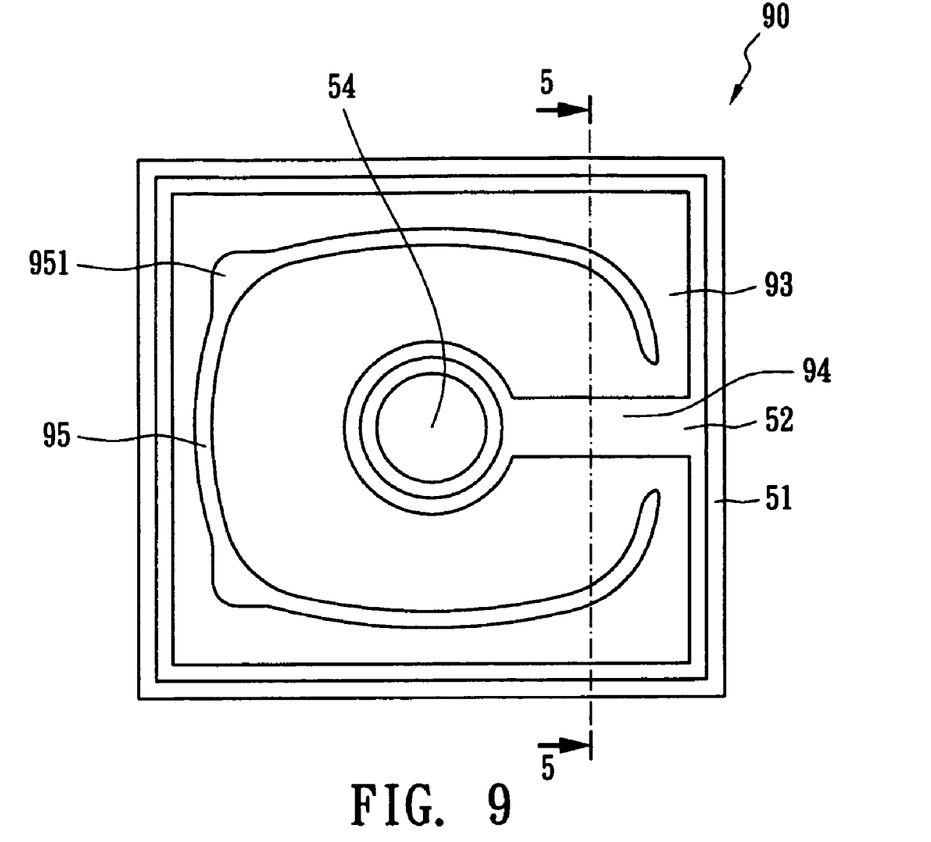
FIG. 9 is a top view of an LED in accordance with the fourth embodiment of the present invention.
Figure 10:
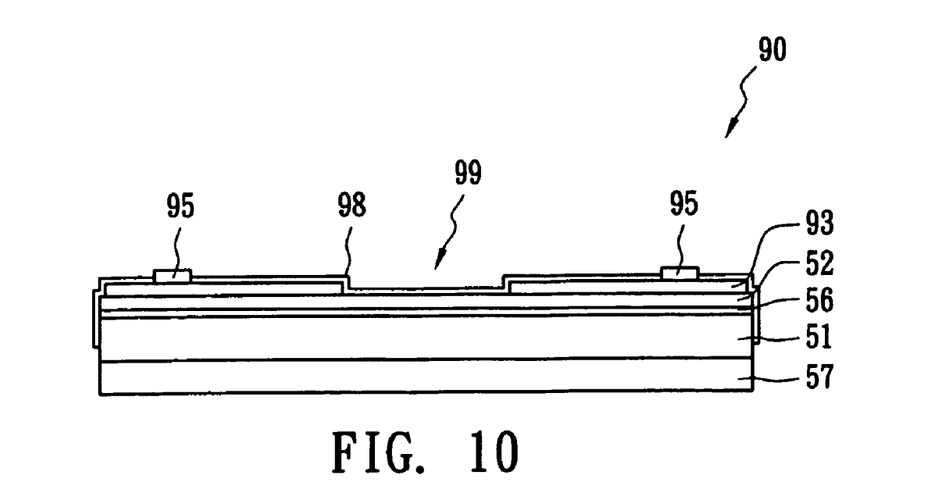
FIG. 10 is a cross-sectional view along line 5-5 in FIG. 9.

In addition to the aforesaid P-type electrode with a closed ring pattern, a P-type electrode 95 can be arranged as an open shape, as show in FIG. 9. FIG. 10 is a cross-sectional view along line 5-5 in FIG. 9. The P-type electrode 95 appears as a character C. There are two soldering pads 951 placed on the route of the P-type electrode 95. Accordingly, the transparent conductive layer 93 beneath the P-type electrode 95 also has a groove 99 which is from the edge of the LED 90 to the neighborhood of the N-type electrode 54 to form a gap 94 on itself. When the LED 90 is mounted to a substrate (not shown) by flip-chip bonding, the groove 99 and gap 94 can prevent the lead of the substrate bonded to the N-type electrode 54 from being shorted to the P-type electrode 95. To protect the transparent conductive layer 93 and the P-type semiconductor layer 52 against oxidation and abnormal contact, a passive layer 98 can be overlaid on the surface of the LED 90 except the surface of the N-type electrode 54 and P-type electrode 95.

Figure 11:
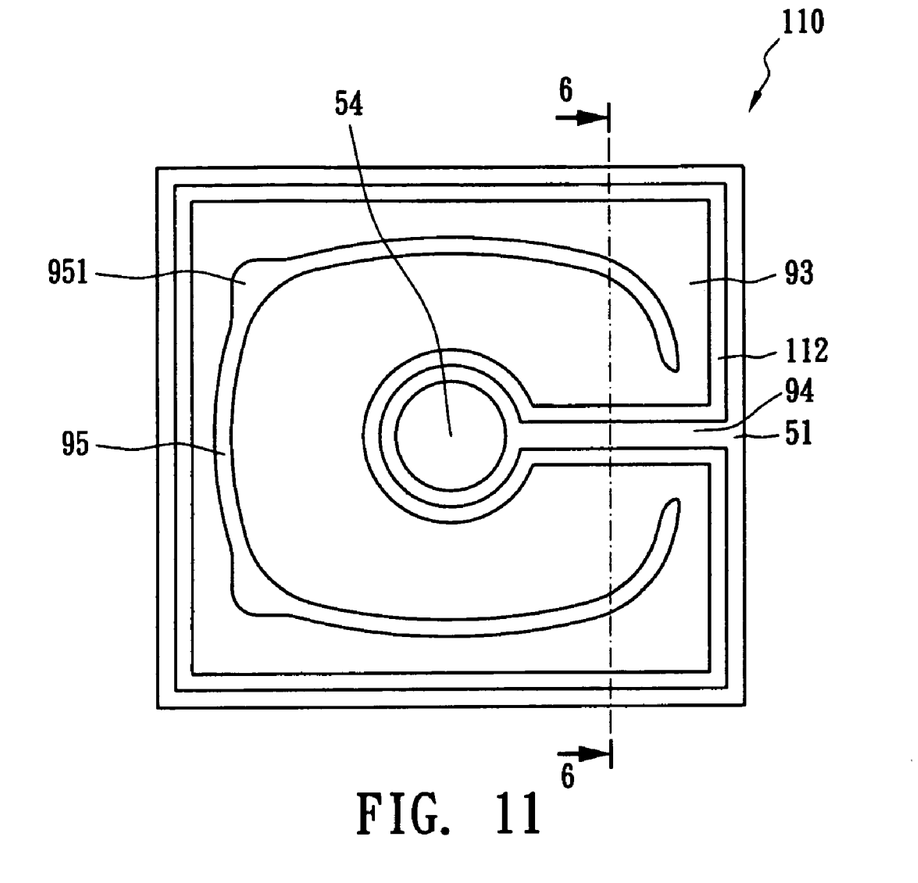
FIG. 11 is a top view of an LED in accordance with the fifth embodiment of the present invention.
Figure 12:
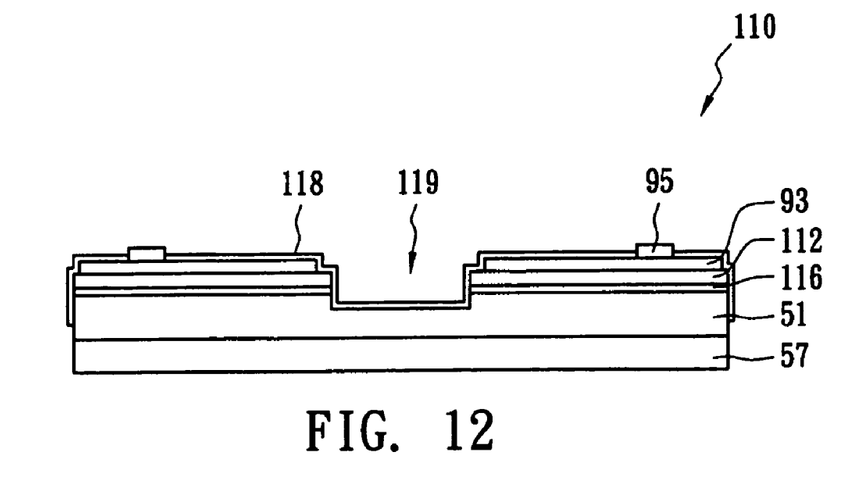
FIG. 12 is a cross-sectional view along line 6-6 in FIG. 11.

As shown in FIG. 11 and FIG. 12, the groove 119 of the LED 110 can be deepened into the N-type semiconductor layer 51. FIG. 12 is a cross-sectional view along line 6-6 in FIG. 11. The groove 119 passes through all of the transparent conductive layer 93, a P-type semiconductor layer 112 and an active layer 116 to form a gap 94. The opening 59 in FIG. 6 and the groove 119 are simultaneously finished during an etching step. Similarly, a passive layer 118 is overlaid on the surface of the LED 110 except the surface of the N-type electrode 54 and P-type electrode 95.

Figure 13:
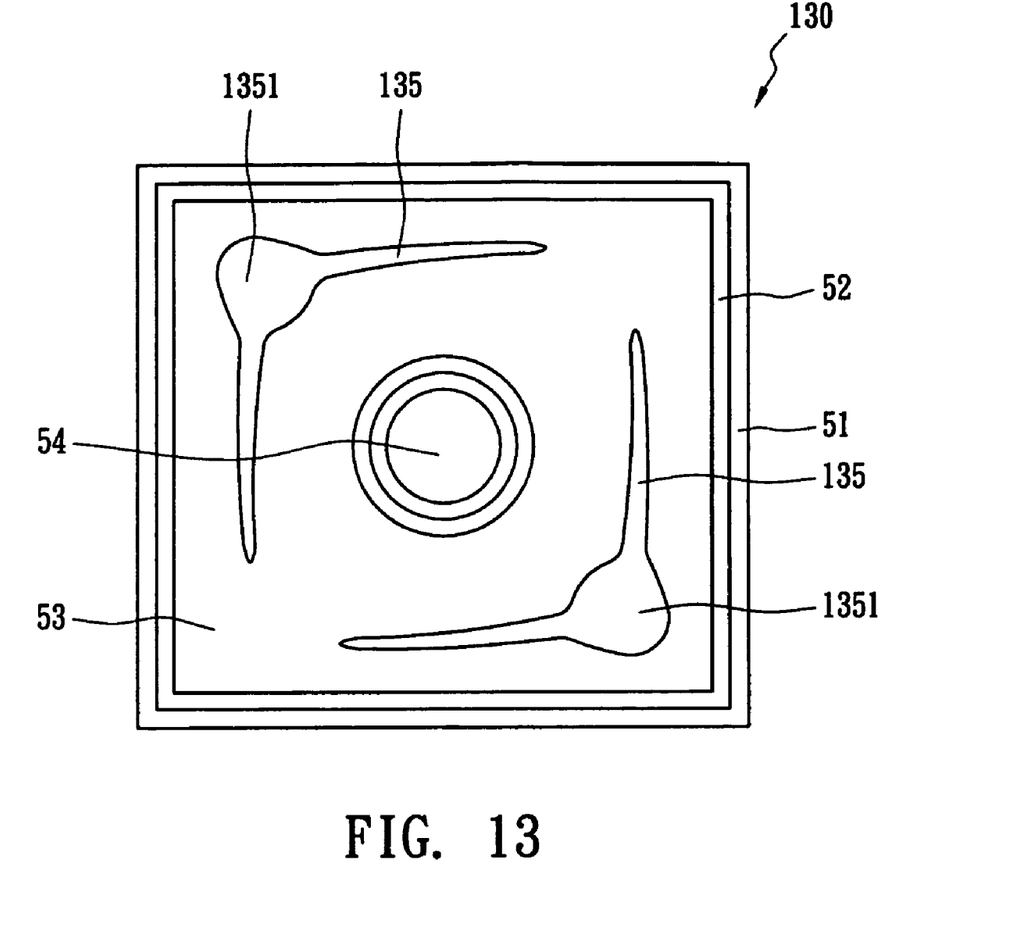
FIG. 13 is a top view of an LED in accordance with the sixth embodiment of the present invention.

In addition to the aforesaid P-type electrode 95 with a C-shaped pattern, two P-type electrodes 135 with L-shaped patterns have the same role, as shown in FIG. 13. Two P-type electrodes 135 with L-shaped patterns are diagonally placed on the LED 130, and a soldering pad 1351 is formed on the turn of each P-type electrode 135.

Figure 14:
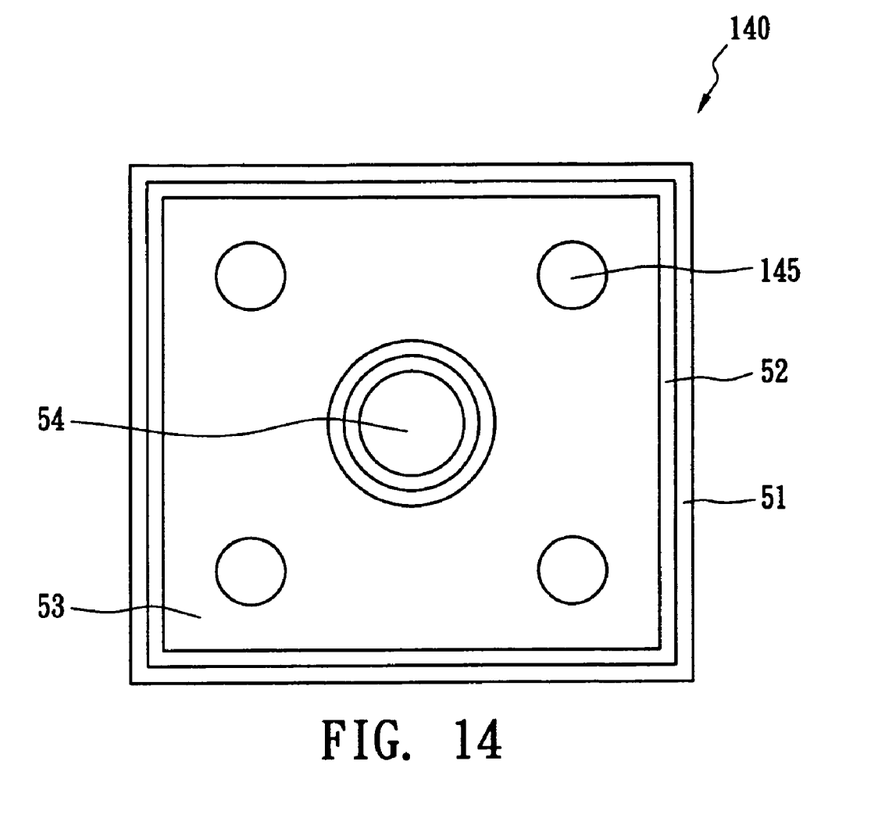
FIG. 14 is a top view of an LED in accordance with the seventh embodiment of the present invention.

Instead of a ring-shaped electrode, a plurality of the round-shaped P-type electrodes 145 surround the N-type electrode 54, as shown in FIG. 14. In addition to four P-type electrodes 145 respectively placed on the corners of the LED 140, three P-type electrodes 145 surrounding the N-type electrode 54 seem like the corners of a triangle at choice.

If the material of the transparent conductive layer 53 is suitable to be bonded to a metal wire or a bump, the P-type electrode can be removed. That is, the whole transparent conductive layer 53 can be regarded as a P-type electrode.

Figure 15:
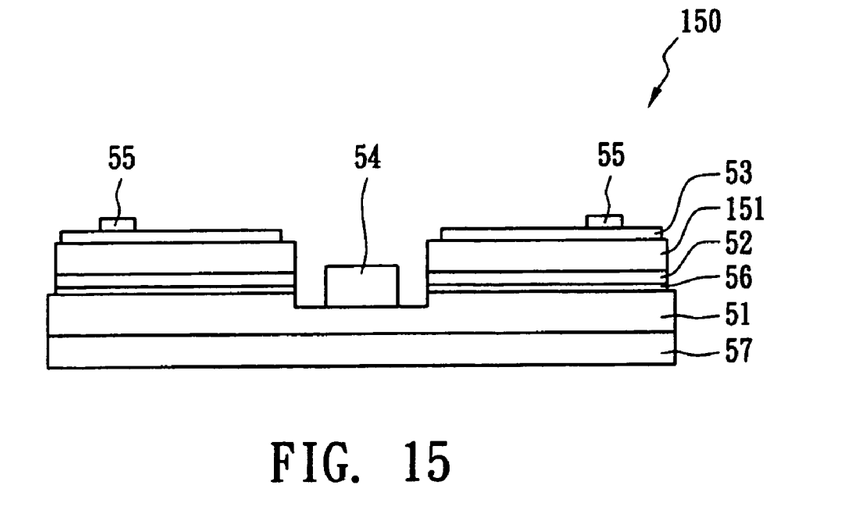
FIG. 15 is a top view of an LED in accordance with the eighth embodiment of the present invention.

As shown in FIG. 15, to improve the illumination efficiency of the LED 150 especially applied to a flip-chip package device, a reflective layer 151 is overlaid on the transparent conductive layer 53. Rays emitted by the active layer 56 are reflected by the reflective layer 151 in the direction opposite to the substrate 57. Therefore, the rays are concentrated on the upper surface of the package device. The substrate (or a submount) is made of made of $Al_2N_3$, silicon, PCB (printed circuit board), metal, etc.

The above-described embodiments of the present invention are intended to be illustrative only. Numerous alternative embodiments may be devised by persons skilled in the art without departing from the scope of the following claims.

What is claimed is:

1. A high power light emitting diode, comprising:
   a substrate;
   an N-type semiconductor layer overlaid on the substrate;
   an active layer formed on a part of the N-type semiconductor layer;
   a P-type semiconductor layer overlaid on the active layer;
   at least one N-type electrode placed on a surface of the N-type semiconductor layer uncovered by the P-type semiconductor layer;
   a transparent conductive layer overlaid on the P-type semiconductor layer and surrounding the N-type electrode;
   at least one P-type electrode surrounding the N-type electrode and being placed on the transparent conductive layer; and
   a groove in the transparent conductive layer and the P-type electrode, transversely extending from one edge of the transparent conductive layer adjacent to one edge of the substrate to the vicinity of the N-type electrode, to prevent electrical short between the N-type electrode and an exterior connection.

2. The high power LED of claim 1, wherein a semi-insulator layer or a non-N-type semiconductor layer is interposed between the N-type semiconductor layer and the substrate.

3. The high power LED of claim 1, wherein the P-type electrode has at least one soldering pad for electrical connection during packaging.

4. The high power LED of claim 1, wherein the P-type electrode has a plurality of divided soldering pads surrounding the N-type electrode.

5. The high power LED of claim 1, wherein the groove is further deepened into the P-type semiconductor layer, the active layer and N-type semiconductor layer.

6. The high power LED of claim 1, further comprising a reflective layer formed on the P-type semiconductor layer or the transparent conductive layer.

7. The high power LED of claim 1, further comprising a passive layer overlaid on the LED.

8. The high power LED of claim 1, wherein the P-type electrode is a transparent conductive layer.

* * * * *